United States Patent [19]

Schweitzer, Jr.

[11] Patent Number: 4,714,916
[45] Date of Patent: Dec. 22, 1987

[54] VOLTAGE LOSS DETECTOR

[76] Inventor: Edmund O. Schweitzer, Jr., 2433 Center St., Northbrook, Ill. 60062

[21] Appl. No.: 845,860

[22] Filed: Mar. 28, 1986

[51] Int. Cl.$^4$ .............................................. G08B 21/00
[52] U.S. Cl. ...................................... 340/664; 324/133
[58] Field of Search ................. 340/654, 664, 663; 324/133, 127, 120, 51; 307/252 F, 301, 283; 320/1

[56] References Cited

U.S. PATENT DOCUMENTS

| | | | |
|---|---|---|---|
| 3,328,690 | 6/1967 | Lockie et al. | 324/122 |
| 3,524,133 | 8/1970 | Arndt | 324/102 |
| 3,524,178 | 8/1970 | Stratton | 324/133 |
| 3,577,041 | 5/1971 | Kring | 361/187 |
| 3,991,366 | 11/1976 | Schweitzer, Jr. | 324/133 |
| 4,152,643 | 5/1979 | Schweitzer, Jr. | 324/120 |
| 4,234,847 | 11/1980 | Schweitzer | 324/146 |
| 4,375,617 | 3/1983 | Schweitzer, Jr. | 324/133 |
| 4,402,033 | 8/1983 | Mayer | 361/187 |
| 4,424,512 | 1/1984 | Schweitzer, Jr. | 340/664 |
| 4,550,288 | 10/1985 | Schweitzer, Jr. | 324/133 |

OTHER PUBLICATIONS

Radio and Electronics Constructor, vol. 28, No. 11, pp. 686–687, Jun. 1975; "Mains Failure Monitor" by N. R. Wilson.

Primary Examiner—James L. Rowland
Assistant Examiner—Jeffery A. Hofsass
Attorney, Agent, or Firm—Lockwood, Alex, FitzGibbon & Cummings

[57] ABSTRACT

A detector for indicating loss of voltage on a monitored conductor includes first and second serially connected capacitors, and a rectifier circuit which derives operating power from the monitored conductor to charge the capacitors in the presence of voltage on the conductor. A forward-biased diode connected across the second capacitor limits the voltage developed across the second capacitor during charging to a relatively low level. Upon loss of voltage a portion of the charge in the first capacitor is transferred to the second capacitor, causing the voltage across the second capacitor to reverse polarity and progressively increase. This causes an enhanced field effect transistor connected across the capacitor to become conductive and discharge the first capacitor through a relay or other indicating device to provide a control effect indicative of voltage loss.

20 Claims, 13 Drawing Figures

VOLTAGE LOSS DETECTOR

BACKGROUND OF THE INVENTION

The present invention relates generally to loss of voltage detectors, and in particular to circuitry for detecting and indicating the loss of voltage in a power distribution system.

It is often necessary in commercial electrical distribution systems to provide an alarm and/or control function in the event of a power interruption. For example, it may be required that electrical power generating equipment be started in the event of a power failure to maintain critical equipment in operation, or that certain types of electrical equipment be disconnected from power mains in the event of a power failure to prevent damage upon restoration of power. Furthermore, in the case of multi-phase power systems, it may be required that certain equipment be disconnected following a failure in one phase in order to avoid potentially damaging single-phase operation of the equipment. Loss of voltage detectors, particularly those adapted for use with commercial power distribution systems, are useful for automatically implementing such procedures in the event of power failure.

In the case of high voltage power mains, high impedance coupling of the loss of voltage detector to the power mains is desirable in order to provide isolation from the high voltages present in the mains. The loss of voltage detector of the present invention utilizes such preferred high impedance coupling for both energization of its circuitry and for providing an external control effect. Consequently, coupling to high voltage conductors can be readily accomplished at such conventional locations as high impedance underground cable termination test points.

The loss of voltage detector of the present invention constitutes an improvement over the detector described in U.S. Pat. No. 4,550,288 of the present inventor, in that it provides a higher impedance input, facilitating its use high impedance test points and on high voltage overhead lines, and a faster recharge time, facilitating the detection of recurring voltage interruptions. Like the detector described in U.S. Pat. No. 4,550,288, the detector of the present invention provides a control effect in the form of closure of a set of relay contacts, which can easily be adapted to actuate other electrical systems and equipment, as described in the patent.

Accordingly, it is a general object of the present invention to provide a new and improved loss of voltage detector.

It is another object of this invention to provide a loss of voltage detector having a high impedance input suitable for use in conjunction with high impedance test points and high voltage electrical power lines.

It is another object of this invention to provide a new and improved loss of voltage voltage detector which is energized and triggered by means of high impedance coupling to a high voltage power line.

SUMMARY OF THE INVENTION

A loss of voltage detector for producing a control effect in response to the loss of voltage in a monitored conductor includes a first capacitor, a second capacitor, and charge circuit means powered by alternating current in the conductor for developing a charging current for charging the first and second capacitors. Voltage limiting means connected across the second capacitor limit the voltage developed across that capacitor during charging. Charge transfer circuit means operable upon interruption of the charging current transfer a portion of the charge on the first capacitor to the second capacitor, causing the terminal voltage across the second capacitor to reverse polarity and progressively increase in the reverse direction as the charge is transferred. Trigger circuit means responsive to the voltage across the second capacitor increasing beyond a predetermined threshold level discharge the first capacitor through an indicating device to provide a control effect following loss of voltage in the conductor.

BRIEF DESCRIPTION OF THE DRAWINGS

The features of the present invention which are believed to be novel are set forth with particularity in the appended claims. The invention, together with the further objects and advantages thereof, can best be understood by reference to the following description taken in conjunction with the accompanying drawings, in the several figures of which like reference numerals identify like elements, and in which:

DESCRIPTION OF THE PREFERRED EMBODIMENT

Figure 1:
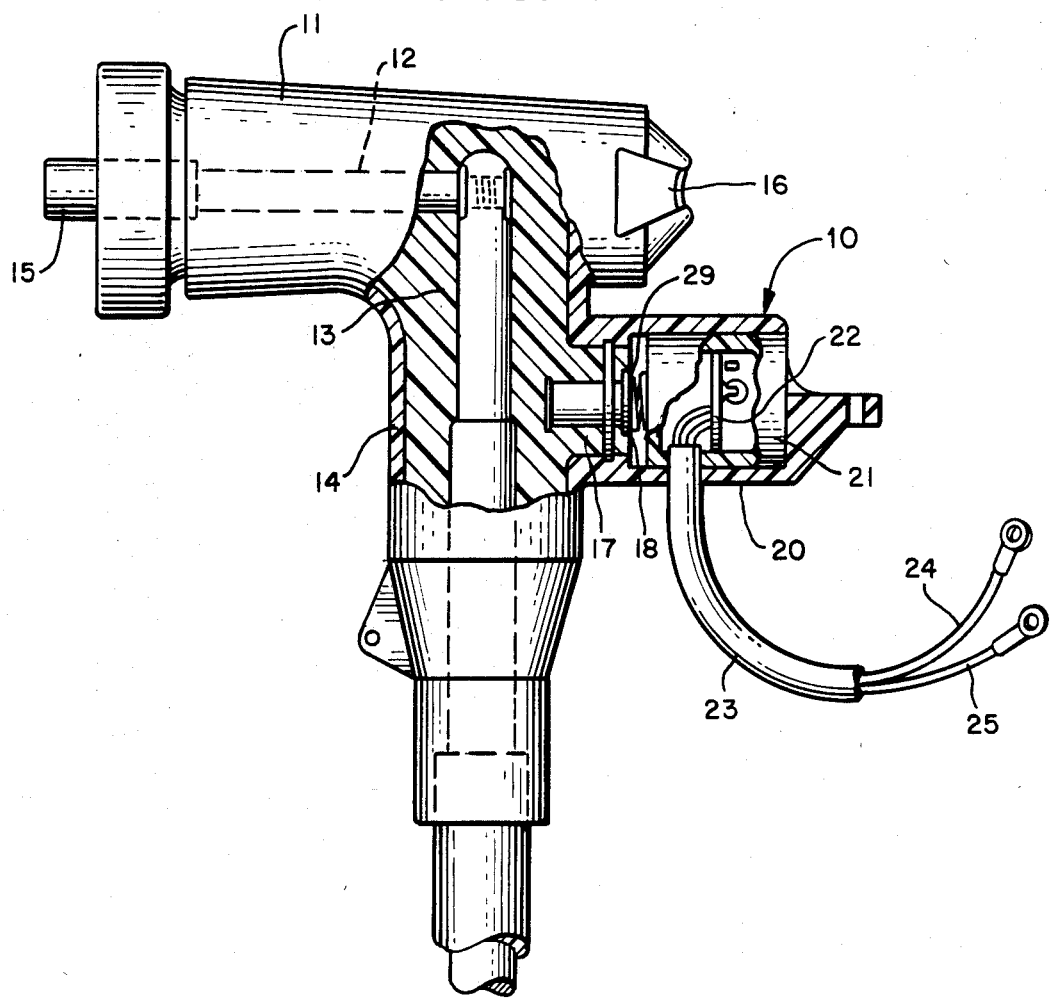
FIG. 1 is a side elevational view, partially in section, of a loss of voltage detector constructed in accordance with the invention installed on the test point terminal of a conventional elbow connector of the type commonly used in power distribution systems.

Referring to the drawings, and particularly to FIG. 1, a loss of voltage detector 10 constructed in accordance with the invention is shown in conjunction with a conventional plug-in elbow connector 11 of the type commonly used in high voltage alternating current systems for establishing plug-in connections to transformers or other devices (not shown). As shown, the connector 11 includes generally an axial conductor 12, an insulating jacket 13, and an electrically-conductive outer sheath 14, the sheath being grounded in accordance with conventional practice. A plug-in contact 15 extends from conductor 12 and is arranged to connect with a complementary contact on the transformer or device to which the connector is connected. A handling loop 16 having ends anchored in the conductive sheath extends from the connector to receive the hooked end of a lineman's tool to facilitate installation and removal of the connector.

In accordance with conventional practice, elbow connector 11 includes along one side a radially-projecting test point 17 which includes an exposed contact 18 capacitively coupled to conductor 12. In operation, loss of voltage detector 10 is mounted on this test point, as illustrated in FIG. 1.

Loss of voltage detector 10 includes a hollow rubber outer shell 20 which is open and dimensioned at one end to engage test point 17. Electrical components of the detector are mounted on a disc-shaped circuit board 22 within a cylindrical housing 21 contained within the outer shell.

In order to interconnect the loss of voltage detector 10 with other equipment, such as an alarm or control system, the detector includes an electrical cable 23 which extends through an aperture in the bottom of shell 20. A pair of conductors 24 and 25 within the cable connect at one end to circuitry on circuit board 22, and at their other end to the equipment to be controlled (not shown).

Circuit board 22 is preferably mounted perpendicular to the axis of housing 21 in a location intermediate the ends thereof, and may be secured in position by a layer of epoxy within the housing. An electrical connection is established between the circuitry of the detector and test point contact 18 by means of a helical spring 29, which is anchored to the circuit board at one end and biased against contact 18 at its other end. Contact 18 is rigidly mounted within the insulating material 13 of connector 11 so that the distal end of the contact is in proximity to conductor 12. This establishes capacitive coupling between the conductor and the contact, thereby providing operating power and loss of voltage sensing capability to the detector. A feature of the loss of voltage detector of the present invention is that satisfactory operation can be achieved with a capacitive coupling between contact 18 and conductor 12 as low as 5 picofarads.

Figure 2:
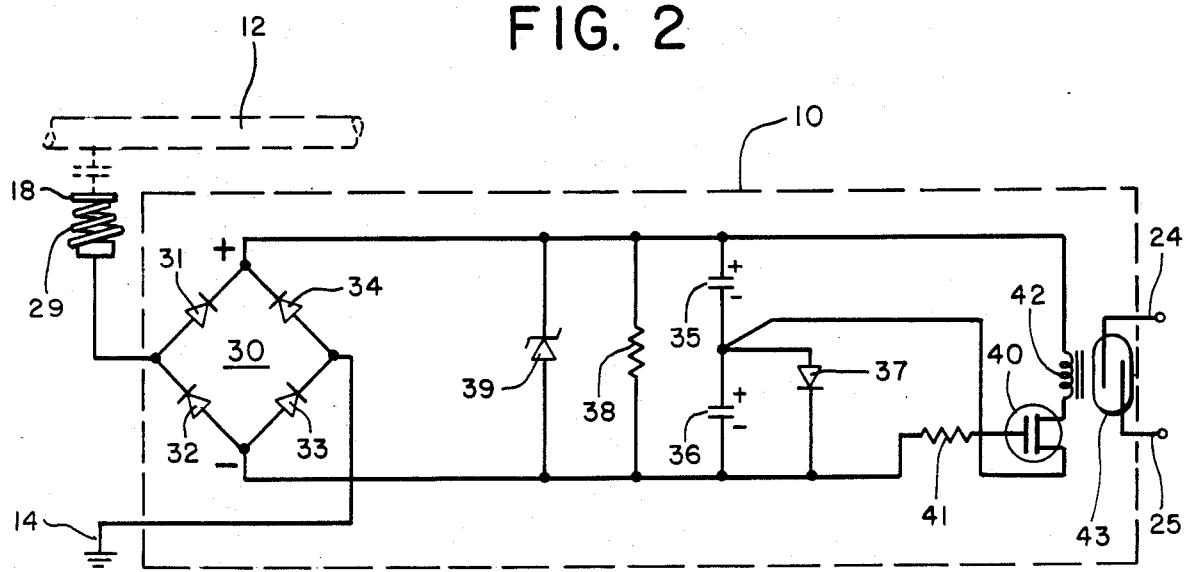
FIG. 2 is an electrical schematic diagram of the loss of voltage detector shown in FIG. 1.
Figure 3:
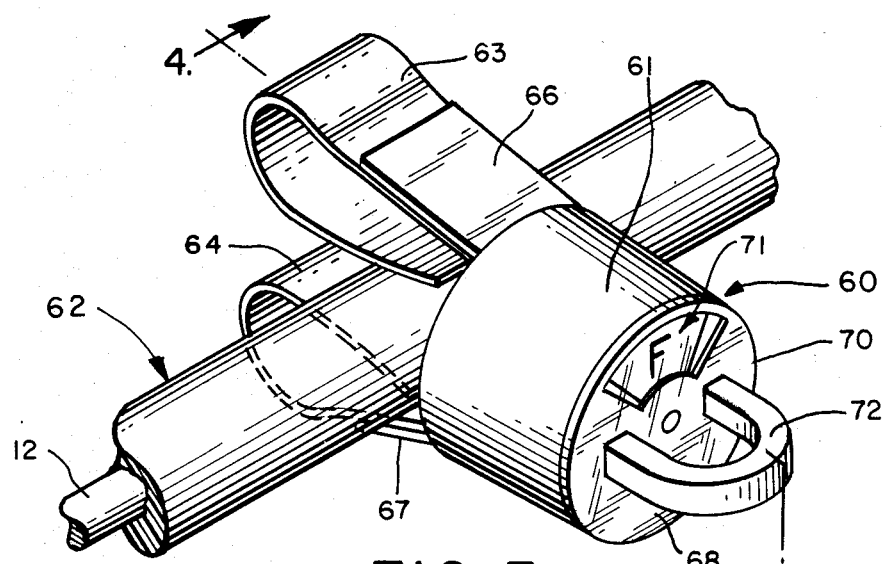
FIG. 3 is a perspective view of an alternate embodiment of the loss of voltage detector of the invention installed on an overhead power line.

Referring to FIG. 2, the loss of voltage detector circuit includes circuit means for producing a pulsating unidirectional charging current in response to alternating voltage present on test point 18. In particular, this circuit means include a bridge rectifier network 30 comprising four rectifier diodes 31-34. One input terminal of network 30, formed at the juncture of the anode of diode 31 and the cathode of diode 32, is electrically connected through helical spring 29 to test point contact 18. The other input terminal of the rectifier network, formed at the juncture of the cathode of diode 33 and the anode of diode 34, is connected to ground through the conductive sheath 14 of the elbow connector. The positive polarity output terminal of the bridge rectifier network is formed at the juncture of the cathodes of diodes 31 and 34, and the negative polarity output terminal is formed at the juncture of the anodes of diodes 32 and 33.

The pulsating unidirectional charging current developed at the output terminals of bridge rectifier network 30 is applied to first and second capacitors 35 and 36, which are connected in series-circuit relationship across the positive and negative polarity output terminals of the network. This causes the capacitors to be charged in the presence of an alternating voltage on conductor 12. A foward-biased diode 37 is connected across capacitor 36 to limit the voltage developed across this capacitor during charging to the forward voltage drop of the diode, typically in the order of 0.7 volts. Capacitor 35 is consequently charged to the difference between this voltage drop and the output of the rectifier network, which may be limited by a zener diode 39 to approximately 50 volts.

To provide for a portion of the relatively greater charge on capacitor 35 to be transferred to capacitor 36 in the absence of a charging current from rectifier network 30, a resistor 38 is connected across the series combination of capacitors 35 and 36. Upon loss of output from rectifier network 30, the relatively greater voltage level across capacitor 35 causes current flow from this capacitor through resistor 38 to capacitor 36. This results in a sudden reversal in polarity and a progressively increasing voltage in the reverse direction across capacitor 36.

To signal the occurrence of the increasing reverse polarity voltage across capacitor 36, an enhanced FET-type transistor 40 is provided with control electrodes connected across the capacitor. In particular, one principal electrode of the transistor is connected directly to the common terminals of capacitors 35 and 36, and the gate electrode of the transistor is connected through a resistor 41 to the remaining non-common terminal of capacitor 36. The remaining principal electrode of the transistor is connected through the magnetic winding of indicator means in the form of a relay 42 to the remaining non-common terminal of capacitor 35. A set of normally open contacts 43 associated with the relay are connected by conductors 24 and 25 to an external device to be controlled.

In operation, with AC voltage present on conductor 12, the unidirectional current pulses produced by bridge rectifier network 30 are applied to capacitors 35 and 36, causing capacitor 36 to be charged to the forward-bias voltage drop of diode 37, and capacitor 35 to be charged to the output voltage level of network 30, less the forward drop of diode 37. In a 60 hertz system, the unidirectional current pulses are produced by network 30 at a rate of 120 hertz, and the discharge time constant of the capacitor circuit, determined primarily by the capacitances of the capacitors and resistor 38, is sufficiently long so that the capacitors remain substantially fully charged to their respective terminal voltages between charge current pulses.

In the event of a power failure in conductor 12, the output of bridge rectifier network 30 drops to zero, whereupon a portion of the relatively greater charge in capacitor 35 is transferred through resistor 38 into the relatively lesser charged capacitor 36. Since diode 37 is reverse-biased to this current flow, the diode has no effect on the charge transfer. Relative to the common connection between capacitors 35 and 36, capacitor 36 experiences a change in polarity and a progressively increasing terminal voltage as the charge transfer progresses. The rate of charge transfer is dependent on the time constant provided by the series combination of capacitors 35 and 36 and resistor 38, and in practice is selected to avoid triggering of the detector in response to transients, while providing a sufficiently fast response to actual voltage losses to avoid damage to controlled equipment. Furthermore, the capacitance of capacitor 36 is preferably substantially less than that of capacitor 35 so that only a small portion of the accumulated charge on capacitor 35 is transferred to capacitor 36. In practice, a capacitance ratio of 100-to-1 or greater may be provided between the two capacitors.

The progressively increasing voltage across capacitor 36 is applied to the gate electrode and one main electrode of transistor 40 through resistor 41. When the applied voltage has reversed polarity so as to forward bias the transistor, and has reached the threshold level of the transistor, typically 3.5 volts, the transistor becomes conductive and capacitor 35 is discharged through the winding of relay 42, closing contacts 43 and providing a control effect to an external device.

Contacts 43 remain closed until capacitor 35 has discharged to a level where insufficient current exists to continue to actuate the relay, after which the contacts open. Since no output is being developed by bridge rectifier network 30 at this time, capacitors 35 and 36 are not recharged and no further control effect is developed. However, upon restoration of voltage in conductor 12 the capacitors are again charged and the voltage reversal across capacitor 36 again conditions transistor 40 to cut-off.

In a typical embodiment intended for use with 60 hertz alternating current power distribution systems, capacitor 35 may have a value of 1 microfarad and capacitor 36 may have a value of 0.01 microfarad. Resistor 38 may have a value of 50 megohms and zener diode 39 may have a threshold voltage of 50 volts. These component values result in capacitor 35 having a discharge time constant of approximately 0.1 second, allowing the voltage loss detector to remain insensitive to momemtary voltage losses of short duration, such as those which may occur during switching operations. Diode 37 may comprise a type 1N4007, transistor 40 may comprise a type IRFD 1Z3 enhanced FET, and resistor 41 may have a value of approximately 50 megohms to provide isolation between capacitor 36 and the transistor.

An alternate embodiment of the invention suitable for mounting directly to a high voltage cable of a power distribution system is shown in FIGS. 3-7. As shown, this loss of voltage detector 60 includes a generally cylindrical housing 61 formed of a hard electrically insulating weather-resistant material such as LEXAN (a trademark of General Electric Company, Schenectady, N.Y.). The detector 60 is secured to a conventional high voltage cable 62 including an internal conductor 12 by means of a pair of resilient inwardly-biased non-electrically conductive retaining arms 63 and 64. The retaining arms, which project rearwardly from housing 61, include end portions 63a and 64a respectively, which are inwardly formed so as to grasp and hold cable 62 in close proximity to the rear wall 65 (FIG. 4) of housing 61. A pair of semi-resilient stiffening members 66 and 67 may be provided in close association with members 63 and 64 to assist in biasing the retaining members against cable 62.

Figure 4:
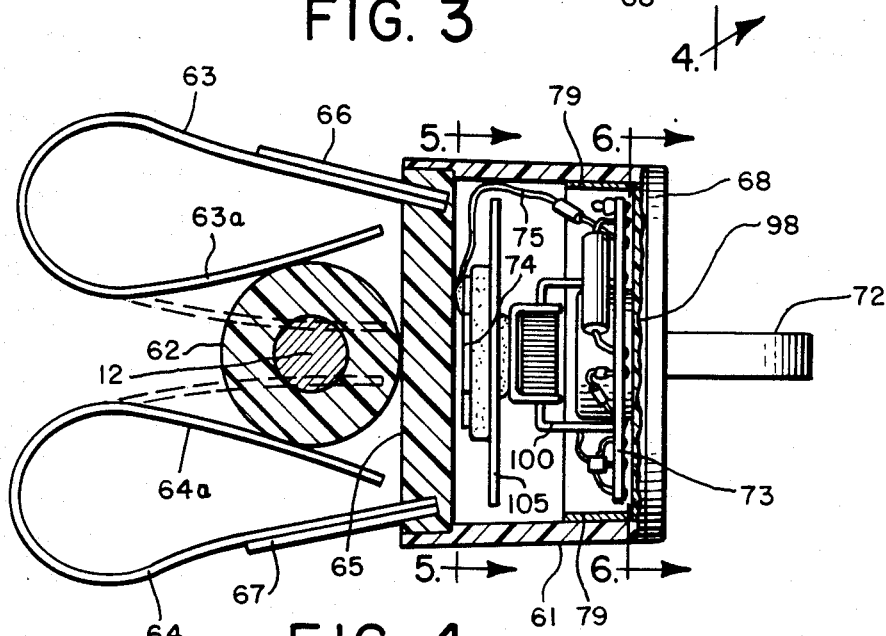
FIG. 4 is a cross-sectional view of the alternate construction taken along line 4—4 of FIG. 3.
Figure 5:
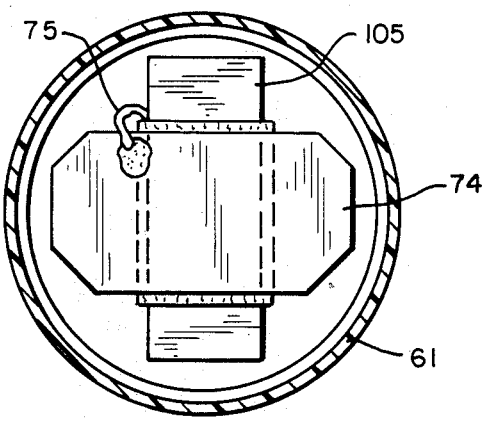
FIG. 5 is a cross-sectional view taken along line 5—5 of FIG. 4.
Figure 6:
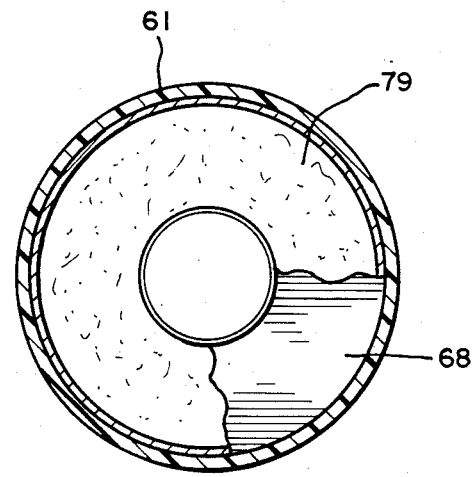
FIG. 6 is a cross-sectional view taken along line 6—6 of FIG. 5.

As shown to best advantage in FIG. 4, upon insertion of cable 62 between the retaining members, the ends of the retaining members are forced apart as shown. This allows housing 61 to be pushed up against the cable, and as the cable abuts the housing the end portions of the retaining members push the cable into engagement. This cable attachment arrangement is described and claimed in the copending application of the present inventor, entitled "Cable Mounted Capacitively-Coupled Electrical Indicating Device", Ser. No. 845,592, filed concurrently herewith.

To provide an indication of voltage loss, detector 60 includes on the front wall 68 of housing 61 a window 70 through which an indicator flag assembly 71 provides a visible indication following voltage loss. A handling loop 72 having ends anchored in the front wall extends from housing 61 to receive the hooked end of a lineman's tool to facilitate installation and removal of the indicator from cable 62.

The various circuit components of the loss of voltage detector are mounted on a circuit board 73 contained within housing 61. Electrostatic coupling between the high impedance detector circuitry and a first pick-up point in the electric field surrounding conductor 12 is provided by a flat electrically conductive plate 74 positioned within housing 61 near rear wall 65 and electrically connected to the circuitry by a conductor 75. Electrostatic coupling to a second pick-up point radially spaced from the first pick-up point relative to conductor 12 is provided by an electrically conductive ring 79 and an underlying electrically conductive coating on the inside surface of housing 61 adjacent and behind front wall 68. This housing construction, which advantageously provides sufficient excitation to the circuitry without the use of external ground plane elements, is described in detail in the aforementioned copending application Ser. No. 845,592 of the present inventor.

Figure 7:
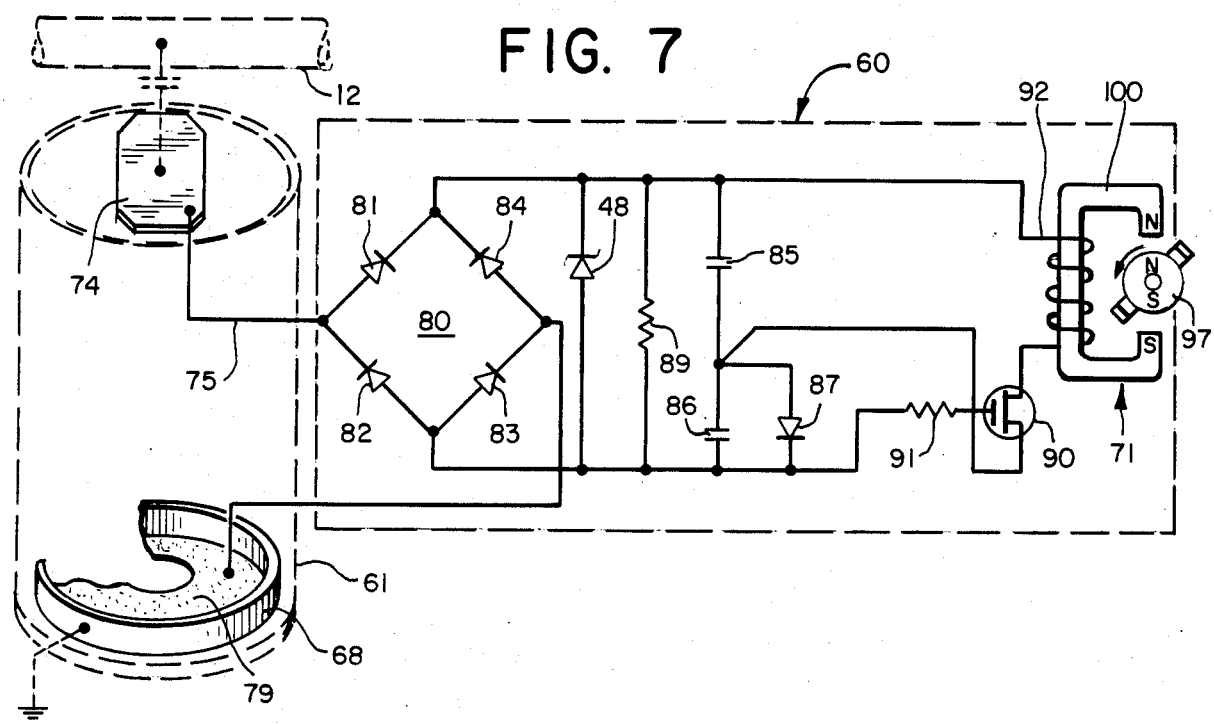
FIG. 7 is an electrical schematic diagram of the loss of voltage detector shown in FIG. 3.

Referring to FIG. 7, the circuitry of loss of voltage indicator 60 may be basically identical to that of indicator 10. Specifically, pickup plate 74 is connected by conductor 75 to one input terminal of a bridge rectifier network 80 comprising rectifier diodes 81-84. The other input terminal of rectifier network 80 is connected to ring 79. With this arrangement, in the presence of a high voltage alternating current on conductor 12 the potential difference provided by plate 40 and by ring 79 is impressed across the input terminals of the rectifier network. The network rectifies this current to develop a pulsating charging current which is applied to capacitors 85 and 86, which are connected in series across the network output terminals. A forward-biased diode 87 limits the voltage developed across capacitor 86 by the changing current and a zener diode 88 connected across the network limits the voltage developed by the network.

Upon loss of excitation a portion of the charge on capacitor 85 is transferred through resistor 89 to capacitor 86, causing the voltage across that device to reverse polarity, and to progressively increase in the reverse direction as the capacitor is charged. When this increasing voltage of reverse polarity reaches the conduction threshold voltage level of an enhanced FET-type transistor 90 having control electrodes connected to the capacitor through a resistor 91, the transistor becomes conductive and causes capacitor 85 to discharge through a magnetic winding 92 of indicator flag assembly 71. This causes the repositioning of a member flag contained in the assembly which, when seen through window 70, alerts an observer that a loss of voltage has occurred in conductor 12.

Figure 8A:
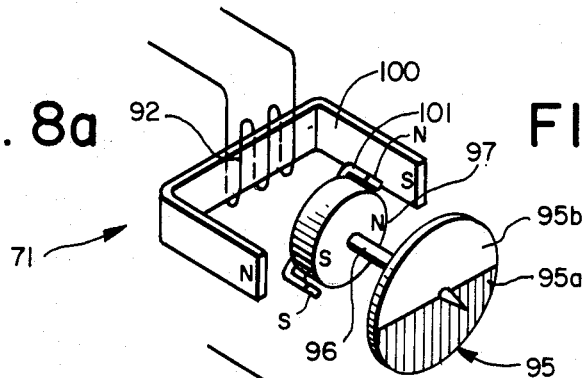
FIGS. 8–10 are a series of views illustrating the functioning of the indicator flag assembly utilized in the loss of voltage detector of FIG. 4.
Figure 8B:
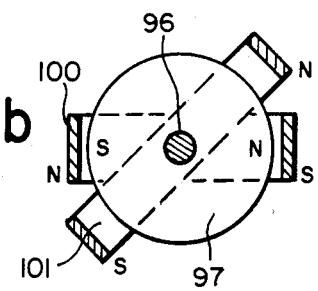
Figure 9A:
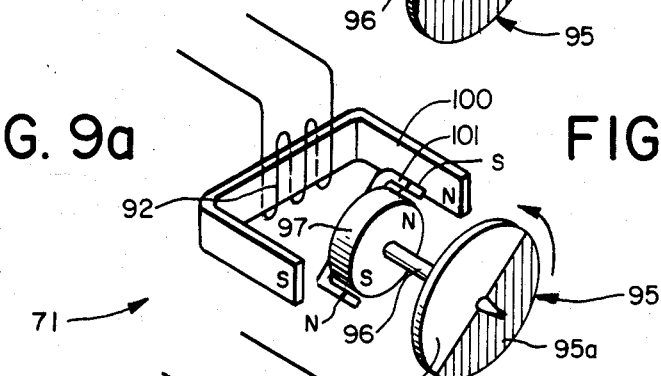
Figure 9B:
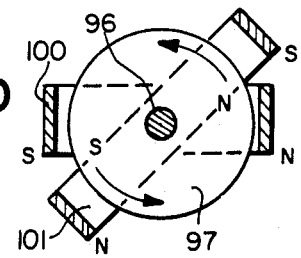
Figure 10A:
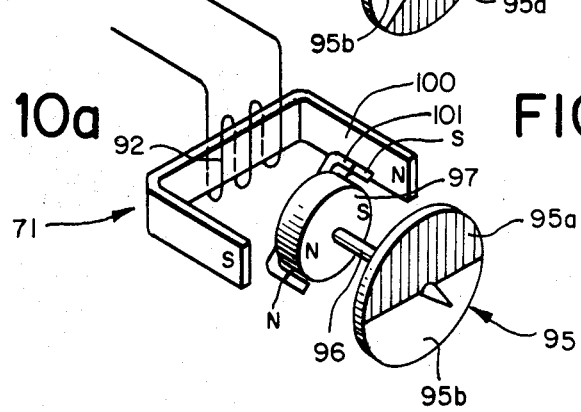
Figure 10B:
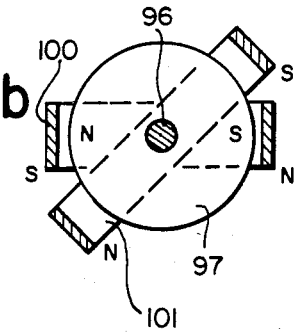

The construction and operation of the indicator flag assembly 71 is illustrated in FIGS. 8-10. The indicator assembly, which is located at the forward end of housing 61, is seen to comprise a disc-shaped flag member 95, a shaft 96, a flag actuator magnet 97, and a generally U shaped pole piece 100. The flag member includes red and white indicator segments 95a and 95b on opposite sides of the axis of rotation. When the flag member is aligned in the reset position shown in FIGS. 8a and 8b only the white indicator segment 95b is visible to the observer through window 70, indicating a reset condition. However, upon occurrence of a fault condition, the flag member rotates 180° such that the red indicator segment 95a is visible through the window indicating that a loss of voltage has occurred.

Actuation of flag member 95 between the reset and fault indicating positions is accomplished by actuator magnet 97, which is rotatably coupled to the flag member by shaft 96. The shaft is maintained in alignment with the axis of housing 61 by means of a bearing surface in an interior divider wall 98, located behind the front wall 68, and a bearing surface in the front wall.

The actuator magnet 97, which may be formed of a magnetic material having a high coercive force, such as ceramic, is formed to provide a pair of diagonally opposed magnetic poles of opposite polarity. The actuator magnet, and hence the indicator flag, are normally biased to the reset-indicating position shown in FIGS. 8a–8b by means of magnetic pole piece 100, which is formed of a magnetic material having a relatively low coercive force, such as chrome steel, and which includes two magnetic poles of the magnetic polarities shown in FIGS. 8a–8b in magnetic communication with the actuator magnet.

Upon loss of voltage in conductor 12, pole piece 100 and an adjacent auxiliary pole piece 101 are remagnetized to the magnetic polarities shown in FIGS. 9a–9b and 10a–10b by the discharge of capacitor 85 through magnetic winding 92, which is located on the pole piece, as shown. As a result, the poles of flag actuator magnet 97 are repelled by adjacent like-polarity poles of the pole pieces and the indicator flag is caused to rotate 180° to the indicating position shown in FIGS. 10a–10b. In this position, the red indicator segment 95a of the indicator flag is visible through window 70 and a lineman viewing the loss of voltage indicator is advised that a voltage loss has occurred in conductor 12.

The indicator flag remains in the loss of voltage indicating position until pole pieces 100 amd 101 are subsequently remagnetized to the magnetic polarities shown in FIGS. 8a–8b by momentary application of a remagnetizing force from external means. In particular, such remagnetizing force may be provided by a permanent magnet held in close proximity to the front wall 68 of loss of voltage indicator 60, the desired remagnetizing effect being confirmed by a simultaneous repositioning of flag indicator 95 to a reset-indicating position as viewed through window 70.

A magnetic shield 105 comprising a flat plate of magnetically conductive material is provided between the actuator assembly and conductor 12 to shield the actuator assembly from the magnet field which accompanies occurrence of a fault current in conductor 12.

While the indicator flag assembly 71 has been shown in conjunction with the cable-suspended loss of voltage indicator of FIGS. 3–7, it will be appreciated that the indicator assembly can also be provided in the test point mounted indicator of FIG. 1. In this case, the indicator flag mechanism would be preferably dimensioned to fit within the indicator housing 21, and magnetic winding 92 would be connected in place of relay winding 42.

By reason of the high input impedance provided by the loss of voltage indicating circuit, sufficient excitation is obtained in test point-mounted and cable-mounted environments for operation of the indicator without the need for external grounding connections or electrically conductive members projecting from the housing. This results in a compact and efficient loss of voltage indicator completely free of external appendages which might produce corona or present a shock hazzard.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A loss of voltage detector for producing a control effect in response to the loss of voltage in a monitored conductor, comprising:
   a first capacitor;
   a second capacitor;
   charge circuit means powered by alternating voltage in the monitored conductor for developing a charge current for charging said first and second capacitors to respective predetermined charge levels;
   charge transfer circuit means operable following interruption of said charge current for transferring a portion of said charge on said first capacitor to said second capacitor, the terminal voltage across said second capacitor progressively increasing as said charge is transferred; and
   triggger ciruit means responsive to the voltage across said second capacitor increasing beyond a predetermined threshold level for discharging said first capacitor to provide the control effect.

2. A loss of voltage detector as defined in claim 1 wherein the capacitance of said second capacitor is substantially less than the capacitance of said first capacitor.

3. A loss of voltage detector as defined in claim 1 wherein said charge circuit means comprise a rectifier circuit capacitively coupled to the monitored conductor.

4. A loss of voltage detector as defined in claim 3 wherein said first and second capacitors are connected in series across the output of said rectifier circuit, one terminal of said first capacitor being connected to one terminal of said second capacitor, and wherein are included voltage limiting means connected across said second capacitor for limiting the voltage developed across said capacitor by said charge current.

5. A loss of voltage detector as defined in claim 4 wherein said charge transfer means comprise a resistor connected between the remaining terminals of said first and second capacitors.

6. A loss voltage detector as defined in claim 5 wherein said trigger circuit means comprise a control effect generating device and a transistor, said transistor having a first main electrode connected to said one terminal of each of said capacitors, and a second main electrode connected through said generating device to the other terminal of the first capacitor, and a gate electrode connected to the other terminal of said second capacitor, and further providing between said gate electrode and said first main electrode a threshold voltage level above which conduction is initiated between said main electrodes.

7. A loss of voltage detector as defined in claim 6 wherein said transistor is a field effect transistor.

8. A loss of voltage detector as defined in claim 6 wherein said control effect generating device includes a magnetic winding actuated by the discharge current produced by said first capacitor.

9. A loss of voltage detector as defined in claim 5 wherein said charge circuit means provide recurring unidirectional current pulses, and the time constant of said charge transfer circuit formed by said first and second capacitors and said resistor sufficiently exceed the pulse period of said charge current pulses such that said first capacitor remains substantially fully charged between said pulses.

10. A loss of voltage detector as defined in claim 4 wherein said voltage limiting means comprise a diode forward-biased to said charging current.

11. A loss of voltage detector as defined in claim 6 wherein said control effect generating device comprises an electrically actuated indicator flag assembly.

12. A loss of voltage detector for producing a control effect in response to the loss of voltage in a monitored conductor, comprising:
   a first capacitor;
   a second capacitor;
   charge ciruit means including a rectifier circuit coupled to and powered from the monitored conductor for developing a charge current for charging said capacitor, said capacitors being connected in series, with one terminal of said first capacitor connected to one terminal of said second capacitor, across the output of said rectifier circuit to receive said charge current;
   voltage limiting means comprising a diode forward-biased to said charge current and connected across said second capacitor for limiting the voltage developed thereacross by said charge current to a predetermined nominal level;
   charge transfer circuit means including a resistor connected across the other terminals of said capacitors and operable following interruption of said charge current for transferring a portion of the charge developed by said charge current on said first capacitor to said second capacitor, the terminal voltage across said second capacitor reversing polarity and progressively increasing in the reverse direction from said predetermined nominal level as said charge is transferred; and
   trigger circuit means responsive to the voltage across said second capacitor increasing beyond a predetermined threshold level for discharging said first capacitor to provide the control effect.

13. A loss voltage detector as defined in claim 12 wherein the capacitance of said capacitor is substantially less than the capacitance of said first capacitor.

14. A loss of voltage detector as defined in claim 12 wherein said trigger circuit means comprise a control effect generating device and a transistor, said transistor having a first main electrode connected to said one terminals of said capacitors, and a second main electrode connected through said generating device to the other terminal of said first capacitor, and a gate electrode connected to the other terminal of said second capacitor, and further having between said gate electrode and said first main electrode threshold voltatge level above which conduction is initiated between said main electrodes.

15. A loss of voltage detector as defined in claim 14 wherein said transistor is a unijunction transistor.

16. A loss of voltage detector as defined in claim 14 wherein said contrl effect generating device includes a magnetic winding actuated by the discharge current produced by said first capacitor.

17. A loss of voltage detector as defined in claim 12 wherein said charge circuit means provide recurring unidirectional current pulses, and the time constant of said charge transfer circuit formed by said first and second capacitors and said resistor sufficiently exceed the pulse period of said charge current pulses such that said first capacitor remains suubstantially fully charged between said pulses.

18. A loss of voltage detector as defined in claim 14 wherein said control effect generating device comprises an electrically actuated indicator flag assembly.

19. A loss of voltage detector for producing a control effect in response to the loss of voltage in a monitored conductor, comprising:
   a first capacitor;
   a second capacitor;
   charge circuit means including a rectifier circuit coupled to and powered by the monitored conductor for developing a charge current for charging said capacitor, said capacitors being connected in series, with one terminal of said first capacitor connected to one terminal of said second capacitor, across the output of said rectifier circuit to receive said charge current;
   voltage limiting means comprising a diode forward-biased to said charge current and connected across said second capacitor for limiting the voltage developed thereacross by said charge current to a predetermiend nominal level;
   charge transfer circuit means including a resistor connected across the other terminals of said capacitors and operable following interruption of said charge current for transferring a portion of the charge developed by said charge current on said first capacitor to said second capacitor, the terminal voltage across said second capacitor reversing polarity and progoressively increasing in the reverse direction from said predetermined nominal level as said charge is transferred;
   a status indicating device including a magnetic winding; and
   trigger circuit means including a field effect transistor having a first main electrode connected to said one terminals of said capacitors, and a second main electrode connected through said magnetic winding to said other terminal of said first capacitor, and a gate electrode connected to said other terminal of said second capacitor, and further having between said gate electrode and said first main electrode a threshold voltage level above which conduction is initiated between said main electrodes, for discharging said first capacitor through said magnetic winding to actuate said status indicating device.

20. A loss of voltage detector as defined in claim 19 wherein the capacitors of said second capacitor is substantially less than the capacitance of said first capacitor.

* * * * *